United States Patent
Cho et al.

(10) Patent No.: US 12,266,400 B2
(45) Date of Patent: Apr. 1, 2025

(54) APPARATUS AND METHOD FOR ZQ CALIBRATION OF DATA TRANSMISSION DRIVING CIRCUIT IN MEMORY CHIP PACKAGE OF MULTI-MEMORY DIE STRUCTURE

(71) Applicant: ELECTRONICS AND TELECOMMUNICATIONS RESEARCH INSTITUTE, Daejeon (KR)

(72) Inventors: Min-Hyung Cho, Daejeon (KR); Young-Deuk Jeon, Sejong-si (KR); Jin Ho Han, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 213 days.

(21) Appl. No.: 17/983,016

(22) Filed: Nov. 8, 2022

(65) Prior Publication Data
US 2023/0147293 A1 May 11, 2023

(30) Foreign Application Priority Data

Nov. 9, 2021 (KR) .................. 10-2021-0152952
Jul. 29, 2022 (KR) .................. 10-2022-0094950

(51) Int. Cl.
*G11C 11/4099* (2006.01)
*G11C 5/04* (2006.01)
*G11C 5/06* (2006.01)

(52) U.S. Cl.
CPC ............ *G11C 11/4099* (2013.01); *G11C 5/04* (2013.01); *G11C 5/063* (2013.01)

(58) Field of Classification Search
None
See application file for complete search history.

(56) References Cited

U.S. PATENT DOCUMENTS

| 8,334,706 B2 | 12/2012 | Moon |
| 9,767,921 B1 | 9/2017 | Pan |

(Continued)

FOREIGN PATENT DOCUMENTS

| KR | 10-2008-0100550 | 11/2008 |
| KR | 10-2021-0027896 | 3/2021 |

OTHER PUBLICATIONS

Song et al., "A 1.1 V 2y-nm 4.35 Gb/s/pin 8 GB LPDDR4 Mobile Device With Bandwidth Improvement Techniques", IEEE Journal of Solid-State Circuits, Aug. 8, 2015, pp. 1945-1959, vol. 50, No. 8.

*Primary Examiner* — J. H. Hur
(74) *Attorney, Agent, or Firm* — KILE PARK REED & HOUTTEMAN PLLC

(57) ABSTRACT

A method for ZQ calibration for a data transmission driving circuit of each memory die in a memory chip package in which memory dies are stacked, includes generating a reference current through a reference resistor connected between a power terminal supplying a power voltage of the data transmission driving circuit and a ground terminal and a first transistor that is diode-connected; supplying first currents corresponding to the reference currents to a pull-up driver of each memory die; performing ZQ calibration of a pull-up driver of a corresponding memory die by comparing a first voltage formed by each first current with a reference voltage formed by the reference current in each of the plurality of memory dies; and performing ZQ calibration of a pull-down driver of the corresponding memory die based on an output impedance of the ZQ calibrated pull-up driver in each of the memory dies.

13 Claims, 8 Drawing Sheets

(56) References Cited

U.S. PATENT DOCUMENTS

| | | | |
|---|---|---|---|
| 10,891,989 B2 | 1/2021 | Satoh et al. | |
| 11,127,462 B2 | 9/2021 | Lee et al. | |
| 11,190,188 B2 | 11/2021 | Cho et al. | |
| 11,217,283 B2 | 1/2022 | Lee et al. | |
| 2002/0063575 A1* | 5/2002 | Kim | G05F 1/46 |
| | | | 326/30 |
| 2008/0284467 A1* | 11/2008 | Koo | H04L 25/0278 |
| | | | 326/30 |
| 2017/0162238 A1* | 6/2017 | Lee | G11C 29/021 |
| 2018/0158495 A1* | 6/2018 | Jeon | G11C 29/028 |
| 2021/0135767 A1 | 5/2021 | Lee et al. | |
| 2021/0366546 A1 | 11/2021 | Lee et al. | |
| 2022/0020442 A1* | 1/2022 | Ji | G11C 29/12005 |

* cited by examiner

APPARATUS AND METHOD FOR ZQ CALIBRATION OF DATA TRANSMISSION DRIVING CIRCUIT IN MEMORY CHIP PACKAGE OF MULTI-MEMORY DIE STRUCTURE

CROSS-REFERENCE TO RELATED APPLICATION

This application claims priority to and the benefit of Korean Patent Application Nos. 10-2021-0152952 and 10-2022-0094950 filed in the Korean Intellectual Property Office on Nov. 9, 2021 and Jul. 29, 2022, the entire contents of which are incorporated herein by reference.

BACKGROUND OF THE INVENTION

(a) Field of the Invention

The present disclosure relates to an apparatus and method for ZQ calibration of a data transmission circuit in a memory chip package having a multi-memory die structure. More particularly, the present disclosure relates to an apparatus and method for ZQ calibration of a data transmission circuit in a memory chip package having a multi-memory die structure capable of reducing the time required for ZQ calibration of the data transmission circuit in a memory chip package having a multi-memory die structure.

(b) Description of the Related Art

A memory device represented by a dynamic random access memory (DRAM) is used as a main memory in most electronic devices that require computation, including personal computers (PC), laptops, servers, smartphones, tablets, and even cars. In order to achieve higher performance in systems such as a PC, not only the processing speed of the processor but also the data input/output speed of the memory should be increased. In addition, recently, in the case of a system for big data processing using artificial intelligence technology, the demand for a memory having a larger capacity and a faster data transmission speed is rapidly increasing due to the processing of a large amount of data.

A double data rate 4th generation (DDR4) memory, which is currently the most used in PCs and servers, has a maximum transmission rate of 3.2 Gbps/pin, and the DDR5 memory of the next-generation standard has a maximum transmission rate of 6.4 Gbps/pin. A graphics double data rate (GDDR) memory, which is a memory specialized for graphics processing unit (GPU) operations used for artificial intelligence calculations and games, currently has a fast transmission rate of up to 16 Gbps/pin. In order to increase the amount of data transmission per unit time as well as to improve the transmission speed, technological development to minimize the time required for refresh of DRAM cells required other than data t transmission, operation mode adjustment, timing calibration, ZQ calibration, etc., is also being continuously progressed by a memory controller.

Maintaining signal integrity is very important for fast data transmission and reception of several GHz or higher in a memory interface, and impedance matching has the greatest effect on signal integrity. That is, when an output impedance of the signal transmitter, an impedance of the signal transmission line, and an input impedance of the signal receiver all match, signal loss due to signal reflection is minimized, and high-speed data transmission and reception become possible. The output impedance of the signal transmitter changes depending on the manufacturing and operating environment, such as changes in the chip manufacturing process, power voltage, temperature, etc., and in general, a change of up to 30% can occur, so the ZQ calibration function to compensate the change is essential.

In a general memory interface, the ZQ calibration apparatus for ZQ calibration of the data transmission driving circuit performs ZQ calibration of the pull-down driver for transmitting a logic low signal, and performs ZQ calibration of the pull-up driver for transmitting a logic high signal based on the ZQ calibration of the pull-down driver.

In the case of a memory chip package of a multi-memory die structure having a structure in which a plurality of memory dies are stacked to increase capacity in one memory chip package, each memory die individually performs ZQ calibration of the pull-down driver and ZQ calibration of the pull-up driver. That is, the time required for ZQ calibration in the memory chip package of a multi-memory die structure increases in proportion to the number of stacked memory dies compared to the time required for ZQ calibration of the one memory die.

The ZQ calibration of the data transmission driving circuit in the memory chip package is performed not only after power is applied to the memory and before data transmission and reception is performed, but is also frequently performed according to a situation when an operating environment such as temperature or power supply voltage changes during memory operation. However, data transmission may be interrupted while the ZQ calibration is being performed. When such a situation occurs, the actual data transmission efficiency is lowered due to data transmission interruption during the ZQ calibration time, so the overall operation efficiency of the system decreases.

SUMMARY OF THE INVENTION

The present disclosure has been made in an effort to provide an apparatus and method for ZQ calibration of a data transmission circuit in a memory chip package having a multi-memory die structure that can reduce the time required for ZQ calibration of the data transmission circuit in a memory chip package having a multi-memory die structure.

According to one embodiment, a method for ZQ calibration for a data transmission driving circuit of each memory die in a memory chip package in which a plurality of memory dies are stacked is provided. The method for ZQ calibration includes: generating a reference current through a reference resistor connected between a power terminal supplying a power voltage of the data transmission driving circuit and a ground terminal and a first transistor that is diode-connected; supplying a plurality of first currents corresponding to the reference currents to a pull-up driver of the plurality of memory dies, respectively; performing ZQ calibration of a pull-up driver of a corresponding memory die by comparing a first voltage formed by each first current with a reference voltage formed by the reference current in each of the plurality of memory dies; and performing ZQ calibration of a pull-down driver of the corresponding memory die based on an output impedance of the ZQ calibrated pull-up driver in each of the plurality of memory dies.

The supplying may include generating the plurality of first currents through a plurality of second transistors forming a current mirror with the first transistor.

Each of the plurality of second transistors may be connected between a pull-up driver of each memory die and a ground terminal, and the first voltage may be a voltage at a node between a pull-up driver of each memory die and each second transistor.

The supplying may include: generating a second current corresponding to the reference current through a second transistor forming a current mirror with the first transistor; generating a plurality of third currents through a plurality of fourth transistors forming a current mirror with a third transistor connected between the power terminal and the second transistor; and generating the plurality of first currents through a plurality of sixth transistors forming a current mirror with each of a plurality of fifth transistors respectively connected between the plurality of fourth transistors and the ground terminal.

Each of the plurality of sixth transistors may be connected between a pull-up driver of each memory die and the ground terminal, and the first voltage may be a voltage at a node between a pull-up driver of each memory die and each sixth transistor.

The performing ZQ calibration of a pull-up driver may include performing ZQ calibration of the corresponding pull-up driver in each of the plurality of memory dies at the same time.

According to another embodiment, an apparatus for ZQ calibration for a data transmission driving circuit of each memory die in a memory chip package in which a plurality of memory dies are stacked is provided. The apparatus for ZQ calibration includes a pull-up calibrator, and a pull-down calibrator. The pull-up calibrator performs ZQ calibration of a pull-up driver by comparing a first voltage supplied to the pull-up driver by a first current with a reference voltage formed by a reference current in each of the plurality of memory dies, wherein the first current corresponds to the reference current generated through a reference resistor connected between a power terminal supplying a power voltage of the data transmission driving circuit and a ground terminal and a first transistor that is diode-connected. The pull-down calibrator performs ZQ calibration of a pull-down driver based on an output impedance of the ZQ calibrated pull-up driver in each memory die.

The pull-up calibrator may include a second transistor configured to form a current mirror with the first transistor and supply the first current to the pull-up driver.

The apparatus for ZQ calibration may further include a reference signal generator that generates the reference voltage by the reference current flowing through the reference resistor and the first transistor that is diode-connected, wherein the reference signal generator may include: a second transistor for generating a second current corresponding to the reference current by forming a current mirror with the first transistor; a third transistor connected between the power terminal and the second transistor; and a plurality of fourth transistors for generating a plurality of third currents by forming a current mirror with the third transistor.

The pull-up calibrator may include: a fifth transistor connected between one of the plurality of fourth transistors and a ground terminal; and a sixth transistor forming a current mirror with the fifth transistor to supply the first current to the pull-up driver.

The pull-up calibrator may include: a pull-up comparator comparing the first voltage with the reference voltage; and a pull-up calibration controller for performing the ZQ calibration of the pull-up driver based on a comparison result of the first voltage and the reference voltage.

The pull-up calibrator of each memory die may simultaneously perform the ZQ calibration of the pull-up driver.

The apparatus for ZQ calibration may further include a reference signal generator that generates the reference voltage by the reference current flowing through the reference resistor and the first transistor diode-connected, wherein the reference signal generator may be formed in one of the plurality of memory dies.

The pull-up calibrator of each memory die may share the reference voltage.

The pull-down calibrator of each memory die may simultaneously perform the ZQ calibration of the pull-down driver.

DETAILED DESCRIPTION OF THE EMBODIMENTS

Figure 1:
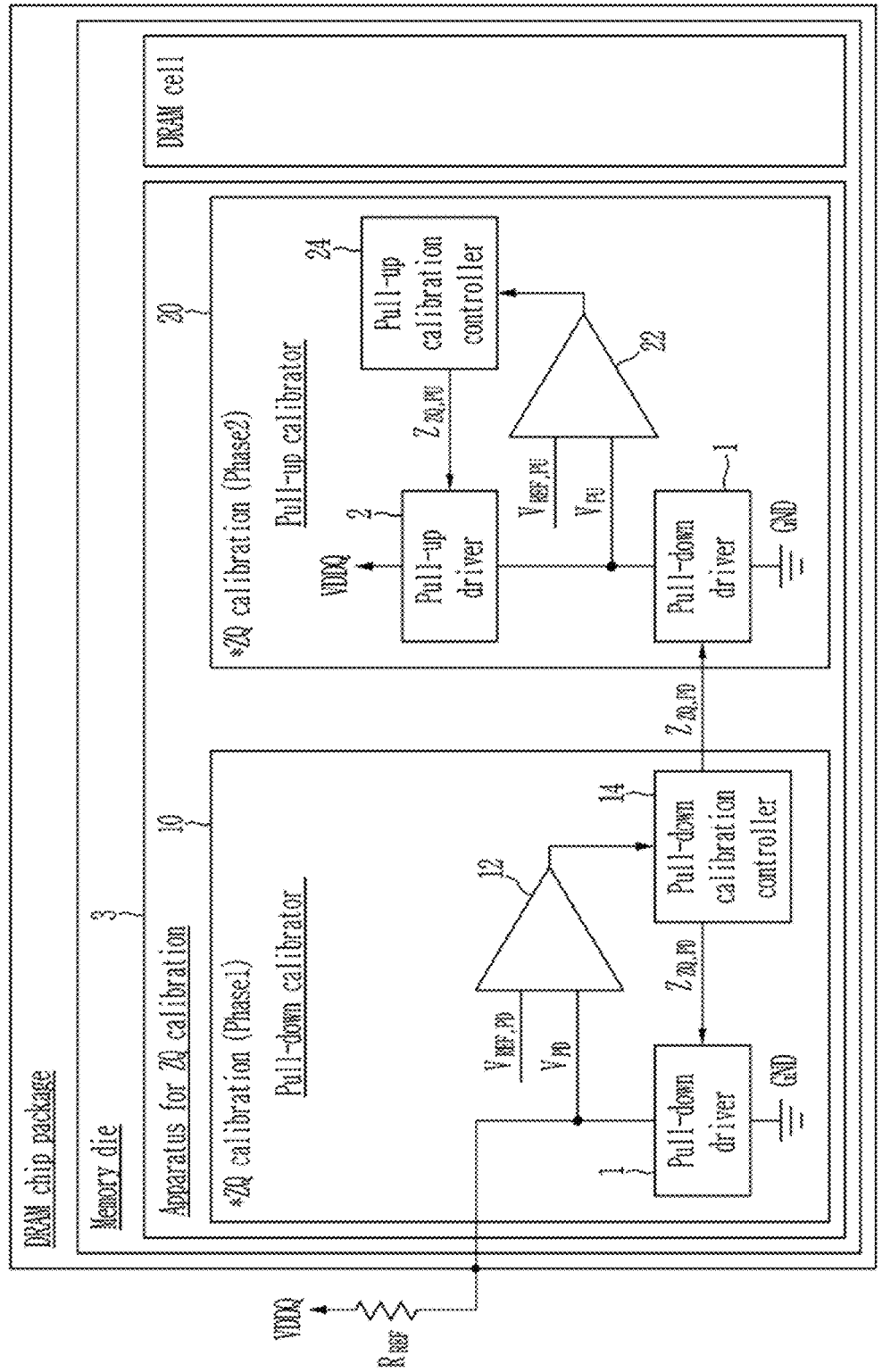
FIG. 1 is a diagram illustrating an apparatus for ZQ calibration of a data transmission driving circuit in a general memory interface.

Hereinafter, embodiments of the disclosure will be described in detail with reference to the attached drawings so that a person of ordinary skill in the art may easily implement the disclosure. As those skilled in the art would realize, the described embodiments may be modified in various different ways, all without departing from the spirit or scope of the disclosure. The drawings and description are to be regarded as illustrative in nature and not restrictive. Like reference numerals designate like elements throughout the specification.

Throughout the specification and claims, when a part is referred to "include" a certain element, it means that it may further include other elements rather than exclude other elements, unless specifically indicated otherwise.

Expressions described in the singular herein may be construed as singular or plural unless an explicit expression such as "one" or "single" is used.

As used herein, "and/or" includes each and every combination of one or more of the recited elements.

In this specification, terms including an ordinal number, such as first, second, etc., may be used to describe various elements, but the elements are not limited by the terms. The above terms are used only for the purpose of distinguishing one element from another element. For example, without departing from the scope of the present disclosure, a first element may be referred to as a second element, and similarly, a second element may be referred to as a first element.

Furthermore, in this specification, each of the phrases such as "A or B", "at least one of A and B", "at least one of A or B", "A, B, or C", "at least one of A, B, and C", and "at least one of A, B, or C" may include any one of the items listed together in the corresponding one of the phrases, or all possible combinations thereof.

Now, an apparatus and method for ZQ calibration of data transmission circuit in a memory chip package having a multi-memory die structure according to an embodiment of the present disclosure will be described in detail with reference to the drawings.

Figure 2:
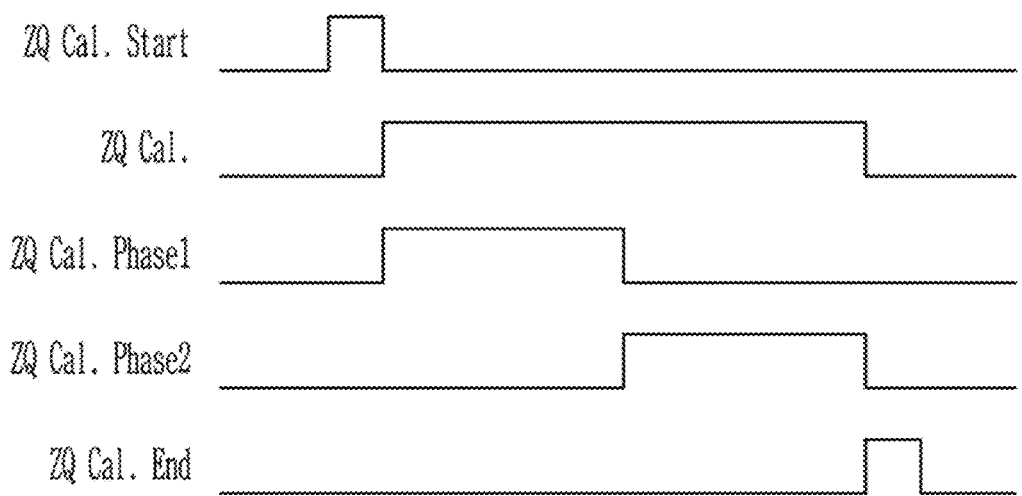
FIG. 2 is a diagram illustrating an operation timing of the apparatus for ZQ calibration shown in FIG. 1.

FIG. 1 is a diagram illustrating an apparatus for ZQ calibration of a data transmission driving circuit in a general memory interface, and FIG. 2 is a diagram illustrating an operation timing of the apparatus for ZQ calibration shown in FIG. 1.

Referring to FIG. 1, a data transmission driving circuit of a memory interface for data transmission includes a pull-down driver 1 for transmitting a logic low signal and a pull-up driver 2 for transmitting a logic high signal. Accordingly, the ZQ calibration is performed for both the pull-down driver 1 and the pull-up driver 2. To this end, the apparatus for ZQ calibration 3 includes a pull-down calibrator 10 and a pull-up calibrator 20.

The pull-down calibrator 10 includes a pull-down comparator 12 and a pull-down calibration controller 14.

The pull-up calibrator 20 includes a pull-up comparator 22 and a pull-up calibration controller 24.

Referring to FIGS. 1 and 2, the apparatus for ZQ calibration 3 starts the ZQ calibration in response to a ZQ calibration start signal ZQ Cal. Start.

According to the ZQ calibration start signal ZQ Cal. Start, the ZQ calibration signal ZQ Cal becomes high level, and the pull-down driver calibration signal ZQ Cal. Phase 1 becomes high level.

The pull-down calibrator 10 of the apparatus for ZQ calibration 3 performs ZQ calibration of the pull-down driver 1 according to the pull-down driver calibration signal ZQ Cal. Phase 1. The pull-down calibrator 10 performs ZQ calibration of the pull-down driver 1 using the pull-down comparator 12 and the pull-down calibration controller 14 so that the output impedance of the pull-down driver 1 is equal to or proportional to the resistance value of the reference resistor $R_{REF}$ based on the reference resistor $R_{REF}$ connected to the outside of the DRAM chip package.

When the ZQ calibration of the pull-down driver 1 is completed, the pull-down driver calibration signal ZQ Cal. Phase 1 becomes low level, and the pull-up driver calibration signal ZQ Cal. Phase 2 becomes high level.

The pull-up calibrator 20 of the apparatus for ZQ calibration 3 performs ZQ calibration of the pull-up driver 2 using the pull-up comparator 2 and the pull-up calibration controller 24 so that the output impedance of the pull-up driver 2 is equal to or proportional to the output impedance of the ZQ calibrated pull-down driver 1 based on the output impedance of the ZQ calibrated pull-down driver 1 according to the pull-up driver calibration signal ZQ Cal. Phase 2.

When the ZQ calibration of the pull-up driver 2 is completed, the pull-up driver calibration signal ZQ Cal. Phase 2 becomes low level, and the ZQ calibration signal ZQ Cal. also becomes low level, while the ZQ calibration end signal ZQ Cal. End becomes high level.

The apparatus for ZQ calibration 3 ends the ZQ calibration operation according to the ZQ calibration end signal ZQ Cal. End.

In this way, the ZQ calibration process of the data transmission for the driving circuit in the memory interface is completed.

Figure 3:
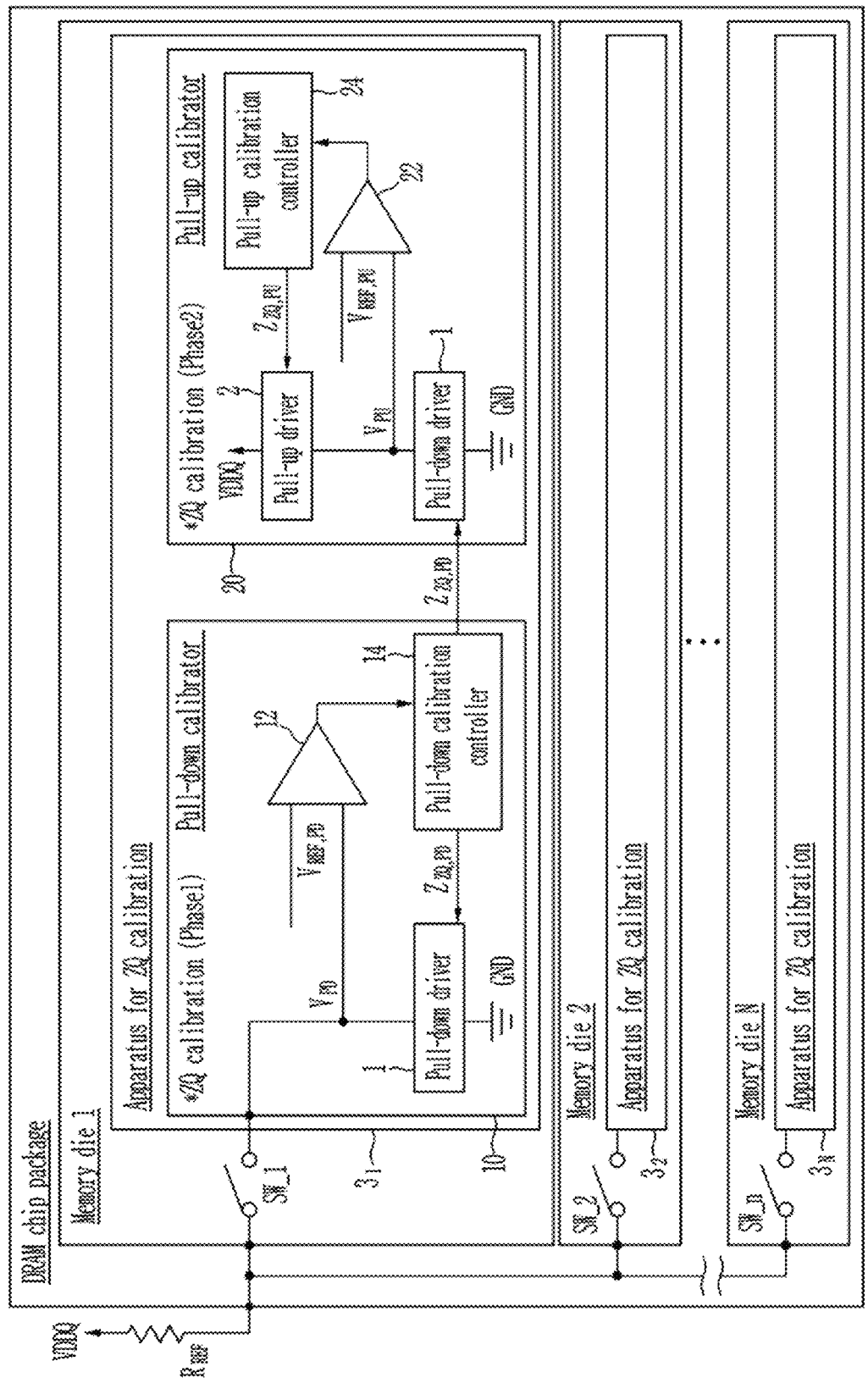
FIG. 3 is a diagram illustrating an apparatus for ZQ calibration of a data transmission driving circuit for a DRAM chip package having a conventional multi-memory die structure.
Figure 4:
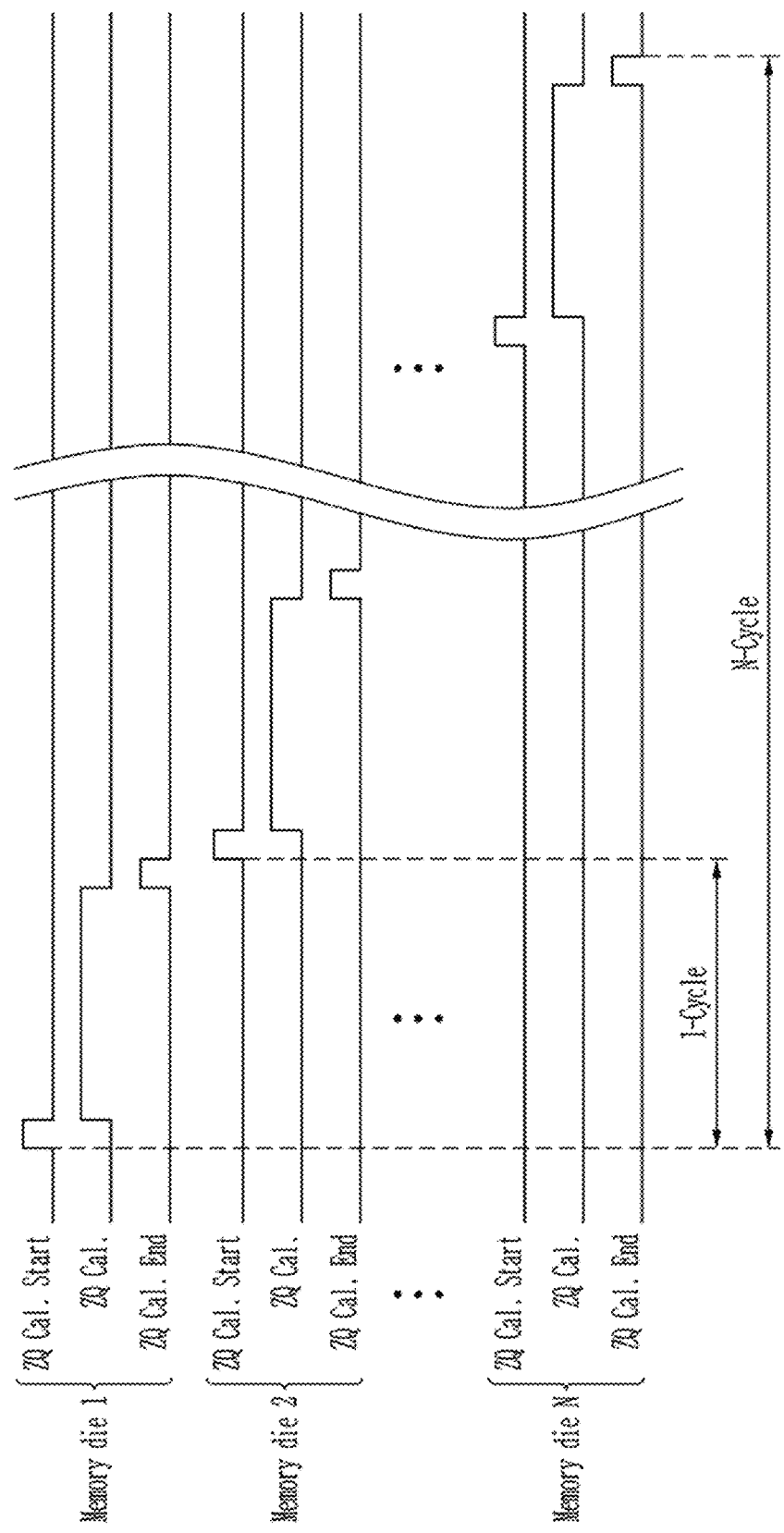
FIG. 4 is a diagram illustrating operation timing of the apparatus for ZQ calibration shown in FIG. 3.

FIG. 3 is a diagram illustrating an apparatus for ZQ calibration of a data transmission driving circuit for a DRAM chip package having a conventional multi-memory die structure, and FIG. 4 is a diagram illustrating operation timing of the apparatus for ZQ calibration shown in FIG. 3.

Referring to FIG. 3, in the DRAM memory, a plurality of memory dies are stacked to increase capacity in one DRAM chip package. Each memory die should individually perform ZQ calibration of the data transmission driving circuit. At this time, due to the limitation of the number of pins of the DRAM chip package, only one reference resistor $R_{REF}$ is used for ZQ calibration. Accordingly, in the case of a DRAM memory having a multi-memory die structure in which a plurality of memory dies are stacked, in order to perform ZQ calibration of the data transmission driving circuit for all of the stacked memory dies, the ZQ calibration is performed for the data transmission driving circuit of each memory die by sequentially sharing the reference resistor $R_{REF}$.

To this end, the apparatuses for ZQ calibration $3_1$ to $3_N$ of the plurality of memory dies each have the same structure as the apparatuses for ZQ calibration 3 described in FIG. 1, and additionally further includes switches SW_1 to SW_N for sequentially sharing the reference resistance $R_{REF}$.

Referring to FIG. 4, when the ZQ calibration of the data transmission driving circuit of the DRAM chip package starts, the switch SW_1 of the memory die 1 set to the on state and the switches SW_2 to SW_N of the other DRAM die are all set to the off state according to the ZQ calibration start signal ZQ Cal. Start of the memory die 1, and then the ZQ calibration for DRAM die 1 is performed.

The ZQ calibration in DRAM die 1 is started according to the ZQ calibration start signal ZQ Cal. Start of memory die 1. Next, as described with reference to FIGS. 1 and 2, the ZQ calibration of the pull-down driver 1 is performed based on the reference resistance $R_{REF}$, the ZQ calibration of the pull-up driver 2 is performed based on the output impedance of the ZQ calibrated pull-down driver 1, and the ZQ calibration of the data transmission driving circuit of the DRAM die 1 is completed according to the ZQ calibration end signal ZQ Cal. End.

Thereafter, according to the ZQ calibration start signal ZQ Cal. Start of memory die 2, the switch SW_1 of the memory die 1 is switched to an off state and the switch SW_2 of the memory die 2 is switched to an on state, so that the ZQ calibration of the data transmission driving circuit of the DRAM die 2 is performed.

This operation is repeated by as many as the number of stacked memory dies to complete the ZQ calibration of the data transmission driving circuit of the entire DRAM chip package.

That is, in the case of a memory chip package having a multi-memory die structure, the time required for ZQ calibration increases in proportion to the number of stacked memory dies compared to the time required for ZQ calibration for one memory die.

The ZQ calibration of the data transmission driving circuit in the memory chip package is performed not only after power is applied to the memory and before data transmission and reception is performed, but is also frequently performed according to situation when an operating environment such as temperature or power supply voltage changes during memory operation. However, data transmission may be interrupted while the ZQ calibration is being performed. When such a situation occurs, the actual data transmission efficiency is lowered due to data transmission interruption during the ZQ calibration time, so the overall operation efficiency of the system decreases.

Hereinafter, a method for reducing the time required for ZQ calibration of the data transmission driving circuit in the memory chip package having a multi-memory die structure will be described in detail.

Figure 5:
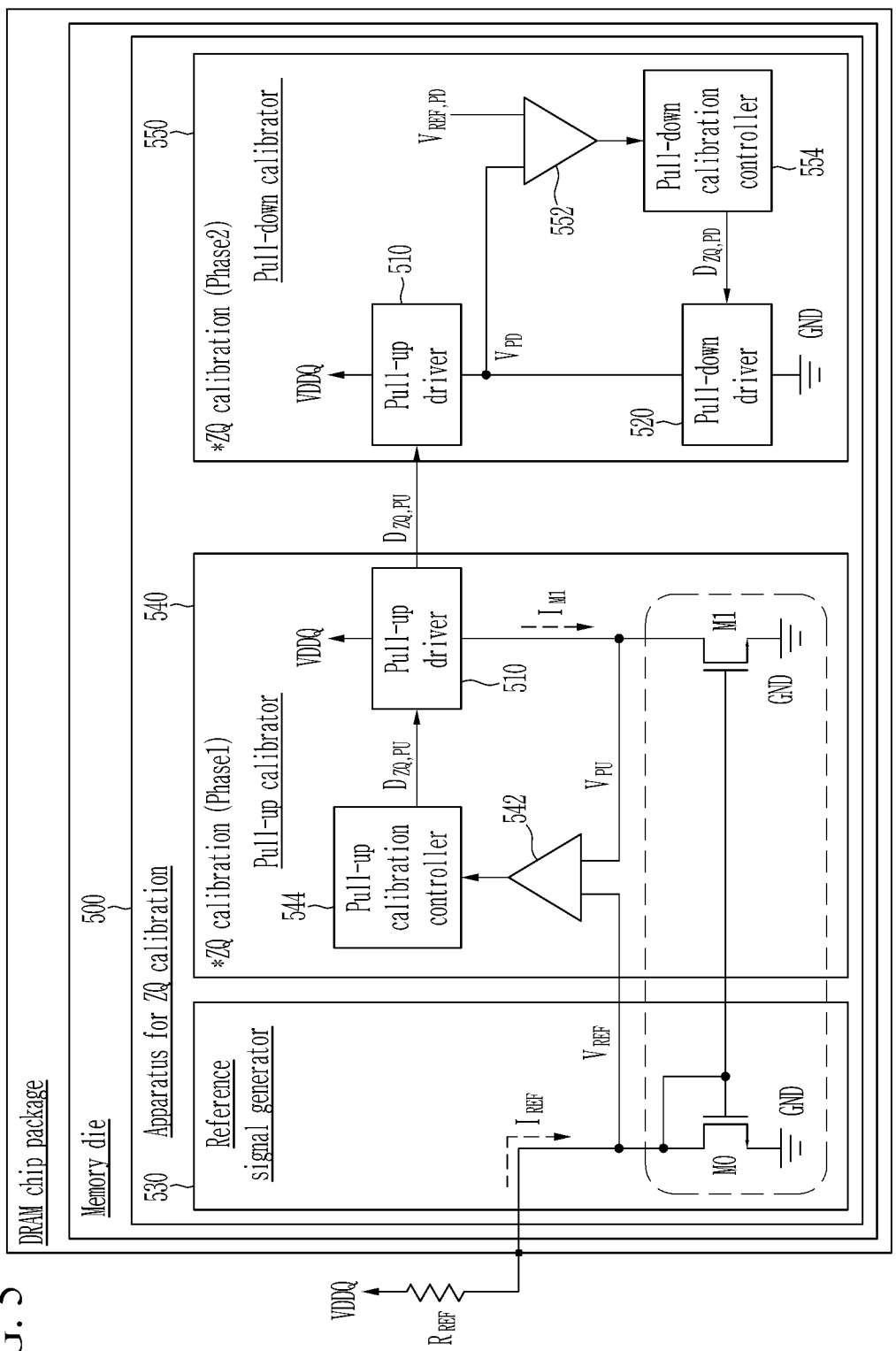
FIG. 5 is a diagram illustrating an apparatus for ZQ calibration of a data transmission driving circuit in a memory interface according to an embodiment.

FIG. 5 is a diagram illustrating an apparatus for ZQ calibration of a data transmission driving circuit in a memory interface according to an embodiment.

Referring to FIG. 5, the apparatus for ZQ calibration 500 separately performs the ZQ calibration of the pull-up driver 510 and the ZQ calibration of the pull-down driver 520, and uses a reference resistor $R_{REF}$. At this time, the apparatus for ZQ calibration 500 further includes a reference signal generator 530 unlike a method of ZQ calibration based on the voltage $V_{PD}$ of the node between the reference resistor $R_{REF}$ and the pull-down driver 1 described with reference to FIG. 1. Meanwhile, the reference signal generator 530 may be implemented independently of the apparatus for ZQ calibration 500 in the memory die. In FIG. 5, the reference signal generator 530 will be described as being implemented in the apparatus for ZQ calibration 500.

The apparatus for ZQ calibration 500 includes a reference signal generator 530, a pull-up calibrator 540, and a pull-down calibrator 550, and the reference voltage $V_{REF}$ is generated through the reference signal generator 530 unlike the conventional method. The apparatus for ZQ calibration 500 first performs the ZQ calibration of the pull-up driver 510 by the pull-up calibrator 540 based on the reference voltage $V_{REF}$, and performs the ZQ calibration of the pull-down driver 520 by the pull-down calibrator 550 based on the output impedance of the ZQ Calibrated pull-up driver 510. As described above, by first performing the ZQ calibration of the pull-up driver 510, it is possible to more simply perform the ZQ calibration while minimizing an additional circuit connection.

The reference signal generator 530 includes a diode-connected transistor M0 between the reference resistor $R_{REF}$ and a ground terminal GND. The reference resistor $R_{REF}$ is connected to a power terminal that supplies the power voltage VDDQ of the data transmission driving circuit. The reference signal generator 530 forms a flow of a reference current $I_{REF}$ through the reference resistor $R_{REF}$ and the transistor M0, and generates a reference voltage $V_{REF}$ at a node between the reference resistor $R_{REF}$ and the transistor M0.

Unlike FIG. 1, the reference voltage $V_{REF}$ generated by the reference signal generator 530 is input to an input terminal of the pull-up comparator 542 of the pull-up calibrator 540. In addition, the pull-up calibrator 540 further includes a transistor M1, differently from FIG. 1. The transistors Mo and M1 are configured in a form of a current mirror. The transistors M0 and M1 may be configured as NMOS transistors.

The drain of the transistor M1 is connected to the pull-up driver 510, the source of the transistor M1 is connected to the ground terminal, and the gate of the transistor M1 is connected to the gate of the diode-connected transistor M0. Thus, a current $I_{M1}$ equal to the reference current $I_{REF}$ flowing through the reference resistor $R_{REF}$ and the transistor M0 flows through the pull-up driver 510 and the transistor M1. The pull-up comparator 542 compares the voltage $V_{PU}$ formed through the current $I_{M1}$ with the reference voltage $V_{REF}$, and the pull-up calibration controller 544 performs the ZQ calibration of the pull-up driver 510 based on the comparison result of the pull-up comparator 542.

Next, the pull-down calibrator 550 performs the ZQ calibration of the pull-down driver 520 based on the output impedance of the ZQ calibrated pull-up driver 510. The pull-down comparator 542 compares the voltage of the node between the ZQ calibrated pull-up driver 510 and the pull-down driver 520 with the pull-down reference voltage $V_{REF.PD}$, and the pull-down calibration controller 554 controls the ZQ calibration of the pull-down driver 520 based on the comparison result of the pull-down comparator 552. The pull-down reference voltage $V_{REF.PD}$ may be set differently according to the type of DRAM or generation of DRAM (DDR3/DDR4/DDR5, LPDDR4/LPDDR5, GDDR5/GDDR6, etc.).

A detailed operation of the apparatus for ZQ calibration 500 of the data transmission driving circuit shown in FIG. 5 is as follows.

The reference current $I_{REF}$ flows through the diode-connected transistor M0 and the reference resistor $R_{REF}$ connected between the power terminal supplying the power supply voltage VDDQ of the data transmission driving circuit and the ground terminal, and a reference voltage $V_{REF}$ at a node between the reference resistor $R_{REF}$ and the transistor M0 is formed due to the flow of the reference current $I_{REF}$.

The diode-connected transistor M0 and the transistor M1 of the pull-up calibrator 540 form a current mirror, so that the current flowing between the drain and the source of the transistor M0 is copied and flows between the drain and the source of the transistor M1, and the relationship of current flowing the transistor M0 and the transistor M1 is determined by the size ratio of the transistor M0 and the transistor M1. That is, when the transistor M0 and the transistor M1 are transistors of the same size, the current $I_{M1}$ flows with the same size as the reference current $I_{REF}$. Meanwhile, when the length of the transistor M0 and the length of the transistor M1 are the same and the width of the transistor M1 is twice that of the transistor M0, the current $I_{M1}$ becomes twice the size of the reference current $I_{REF}$.

Assuming that the transistor M0 and the transistor M1 have the same size, the current $I_{M1}$ has the same size as the reference current $I_{REF}$, and the current $I_{M1}$ flows through the pull-up driver 510 connected to the power terminal supplying the power supply voltage VDDQ, thus, a voltage $V_{PU}$ of the node between the pull-up driver 510 and the transistor M1 is formed. The pull-up comparator 542 compares the voltage $V_{PU}$ and the reference voltage $V_{REF}$, and the pull-up calibration controller 544 adjusts the output impedance of the pull-up driver 510 so that the voltage $V_{PU}$ and the reference voltage $V_{REF}$ are equal. When the output impedance of the pull-up driver 510 is greater than the value of the reference resistor $R_{REF}$, the voltage $V_{PU}$ is lower than the reference voltage $V_{REF}$. The pull-up calibration controller 544 provides a control signal $D_{ZQ.PU}$ for reducing the output impedance of the pull-up driver 510 to the pull-up driver 510 when the voltage $V_{PU}$ is lower than the reference voltage $V_{REF}$ based on the comparison result of the pull-up comparator 542. Meanwhile, when the output impedance of the pull-up driver 510 is smaller than the value of the reference resistor $R_{REF}$, the voltage $V_{PU}$ is higher than the reference voltage $V_{REF}$. The pull-up calibration controller 544 provides a control signal $D_{ZQ.PU}$ for increasing the output impedance of the pull-up driver 510 to the pull-up driver 510 when the voltage $V_{PU}$ is higher than the reference voltage $V_{REF}$ based on the comparison result of the pull-up comparator 542. When the output impedance of the pull-up driver 510 becomes equal to the value of the reference resistor $R_{REF}$, the voltage $V_{PU}$ becomes equal to the reference voltage $V_{REF}$, so that the ZQ calibration of the pull-up driver 510 is completed.

Next, when the ZQ calibration of the pull-up driver 510 is completed, the ZQ calibration of the pull-down driver 520 is performed by the pull-down calibrator 550. The pull-down calibrator 550 performs the ZQ calibration of the pull-down driver 520 based on the output impedance of the ZQ calibrated pull-up driver 510. The pull-down comparator 542 compares the voltage $V_{PD}$ of the node between the ZQ calibrated pull-up driver 510 and the pull-down driver 520 with the pull-down reference voltage $V_{REF,PD}$, and the pull-down calibration controller 554 adjusts the output impedance of pull-down driver 520 by transmitting the control signal $D_{ZQ,PD}$ to the pull-down driver 520 so that the voltage $V_{PD}$ and the pull-down reference voltage $V_{REF,PD}$ are equal to each other.

The current mirror composed of the transistors M0 and M1 shown in FIG. 5 is a description of the most basic current mirror structure as an example, and other current mirror structures for minimizing the effect of mismatch between actual transistors are also applicable.

In the case of the conventional structure shown in FIG. 1, the reference resistance $R_{REF}$ and the pull-down driver 1 to be calibrated ZQ are connected through a DRAM chip package, so that a large parasitic value of several pF is generated at the node where the voltage $V_{PD}$ is formed. Accordingly, in the ZQ calibration process of the pull-down driver 1, the settling time is increased due to the large parasitic capacitance, thereby limiting the ZQ calibration operation speed of the pull-down driver 1. However, in the case of the structure shown in FIG. 5, since there is no parasitic capacitance of a large value formed by the package and the input/output pad at the node where the voltage $V_{PD}$ of the ZQ calibration loop of the pull-up driver 510 is formed by the reference resistor $R_{REF}$ and the current mirror, the operation speed of the ZQ calibration loop may be increased compared to the existing structure.

Figure 6:
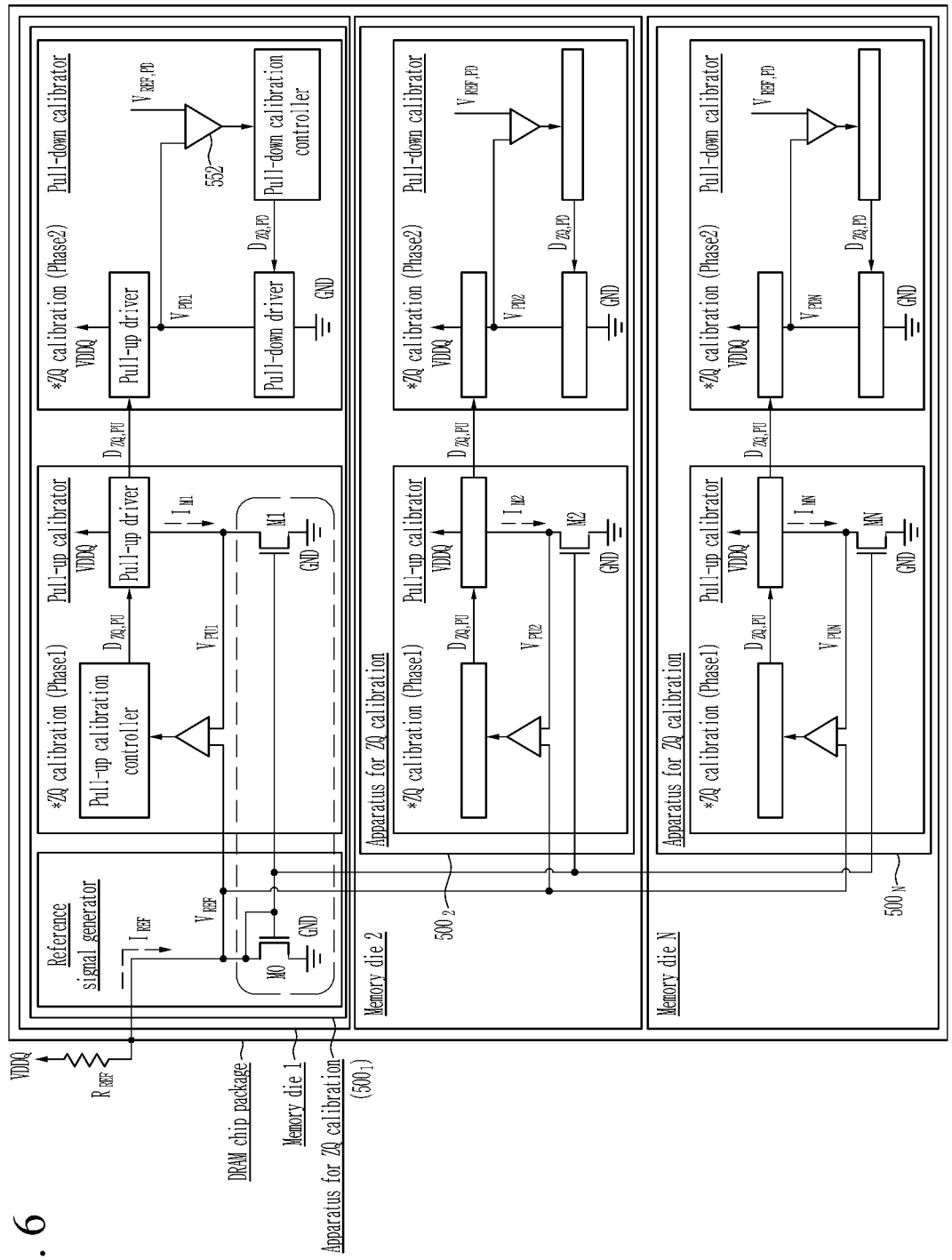
FIG. 6 is a diagram illustrating an apparatus for ZQ calibration of a data transmission driving circuit for a memory chip package having a multi-memory die structure based on the structure disclosed in FIG. 5.
Figure 7:
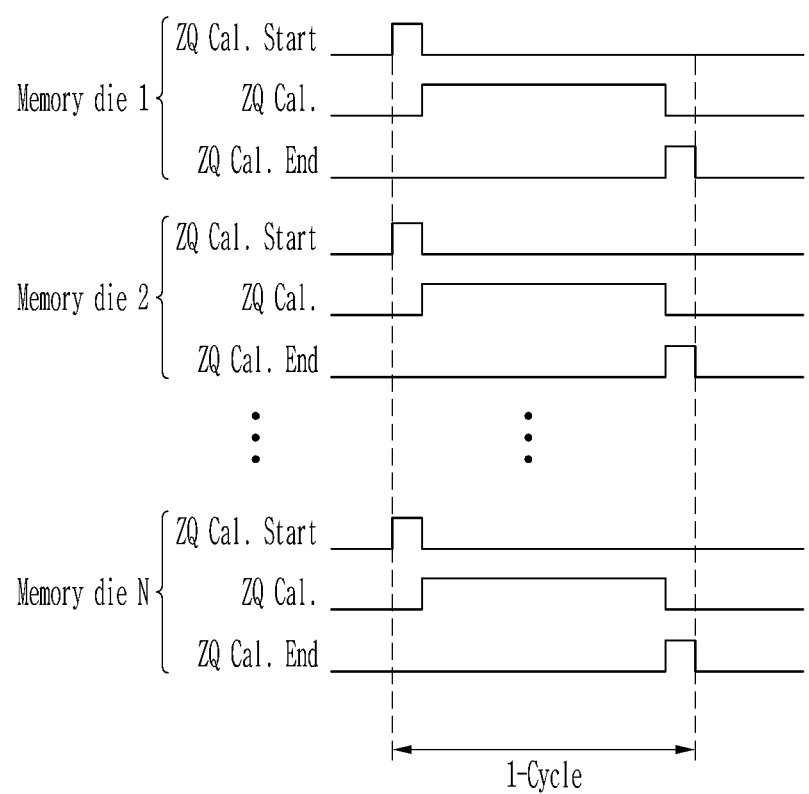
FIG. 7 is a diagram illustrating operation timing of the apparatus for ZQ calibration shown in FIG. 6.

FIG. 6 is a diagram illustrating an apparatus for ZQ calibration of a data transmission driving circuit for a memory chip package having a multi-memory die structure based on the structure disclosed in FIG. 5, and FIG. 7 is a diagram illustrating operation timing of the apparatus for ZQ calibration shown in FIG. 6.

Referring to FIG. 6, the apparatus for ZQ calibration $500_1$ of the memory die 1 has the same structure as the apparatus for ZQ calibration 500 illustrated in FIG. 5.

The apparatus for ZQ calibration $500_2$ to $500_N$ of the memory die 2 to the memory die N have a structure in which the reference signal generator 530 including the diode-connected transistor M0 in the memory die 1 is not present. Instead, the reference voltage $V_{REF}$ generated by the reference signal generator 530 of the memory die 1 is shared by the apparatus for ZQ calibration $500_2$ to $500_N$ of the memory die 2 to the memory die N. The apparatus for ZQ calibration $500_2$ to $500_N$ of the memory die 2 to the memory die N form an additional current mirror using the shared reference voltage $V_{REF}$ so that currents $I_{M2}$ to $I_{MN}$ that are equal to the current $I_{M1}$ formed by the current mirror in memory die 1 flow through to the pull-up driver 510 to be ZQ calibrated. That is, when the transistors M1 to MN are all transistors of the same size, the currents $I_{M1}$ to $I_{MN}$ have the same current value as the current $I_{REF}$.

The pull-up calibrator 540 of each memory die compares the shared reference voltage $V_{REF}$ with the voltages $V_{PU1}$ to $V_{PUN}$ formed by the respective currents $I_{M1}$ to $I_{MN}$, and performs ZQ calibration of the pull-up driver 510 in all memory dies simultaneously.

Thereafter, the pull-down calibrator 550 for each memory die performs ZQ calibration of the pull-down driver 520 based on the output impedance of the ZQ calibrated pull-up driver 510.

The pull-down comparator 542 of the pull-down calibrator 550 of each memory die compares the voltages $V_{PD1}$ to $V_{PDN}$ of the nodes between the ZQ calibrated pull-up driver 510 and the pull-down driver 520 with the pull-down reference voltage $V_{REF,PD}$, and the pull-down calibration controller 554 performs the ZQ calibration of the pull-down driver 520 based on the comparison result of the pull-down comparator 542.

By doing so, the ZQ calibration of the data transmission driving circuit of the entire memory die is completed.

The ZQ calibration in the DRAM chip package of the conventional multi-memory die structure described with reference to FIG. 3 requires sequentially connecting a reference resistor $R_{REF}$ to each memory die, so the ZQ calibration time increases in proportion to the number of memory dies included in the DRAM chip package. However, the method for ZQ calibration of the data transmission driving circuit for a DRAM chip package having a multi-memory die structure shown in FIG. 6 generates a reference voltage $V_{REF}$ in one memory die using the reference resistor $R_{REF}$, and shares the reference voltage $V_{REF}$ in the apparatus for ZQ calibration $500_1$ to $500_N$ of all memory dies. As a result, as shown in FIG. 7, the apparatus for ZQ calibration $500_1$ to $500_N$ of each memory die may simultaneously perform ZQ calibration of the corresponding data transmission driving circuit. Accordingly, regardless of the number of memory dies stacked in one DRAM chip package, it is possible to complete the ZQ calibration of the entire DRAM chip package of a multi-memory die structure within the ZQ calibration time of the data transmission driving circuit for one memory die.

Meanwhile, the reference signal generator 530 may be implemented independently of the apparatus for ZQ calibration 500 in the memory die 1. In this case, the reference voltage $V_{REF}$ generated by the reference signal generator 530 of the memory die 1 is shared by the apparatus for ZQ calibration $500_1$ to $500_N$ of the memory die 1 to the memory die N, and the apparatus for ZQ calibration $500_1$ to $500_N$ of the memory die 1 to the memory die N form a current mirror using the shared reference voltage $V_{REF}$.

In the case of the current mirror structure used in FIGS. 5 and 6, a current used for ZQ calibration is generated by sharing one reference voltage $V_{REF}$ in all memory dies. In this case, the amount of current generated for use in correction may vary due to a mismatch between the transistors of the memory dies.

Referring to FIG. 6, the amount of the respective generated currents $I_{M1}$ to $I_{MN}$ vary by the mismatch size of the transistors M1 to MN. In particular, in the case of the mismatch of the transistors M1 to MN, the mismatch between different memory dies is usually larger than the mismatch within one memory die, so the output impedance calibrated ZQ by the mismatch may also vary in each memory die. A structure for compensating for these shortcomings will be described in detail with reference to FIG. 8.

Figure 8:
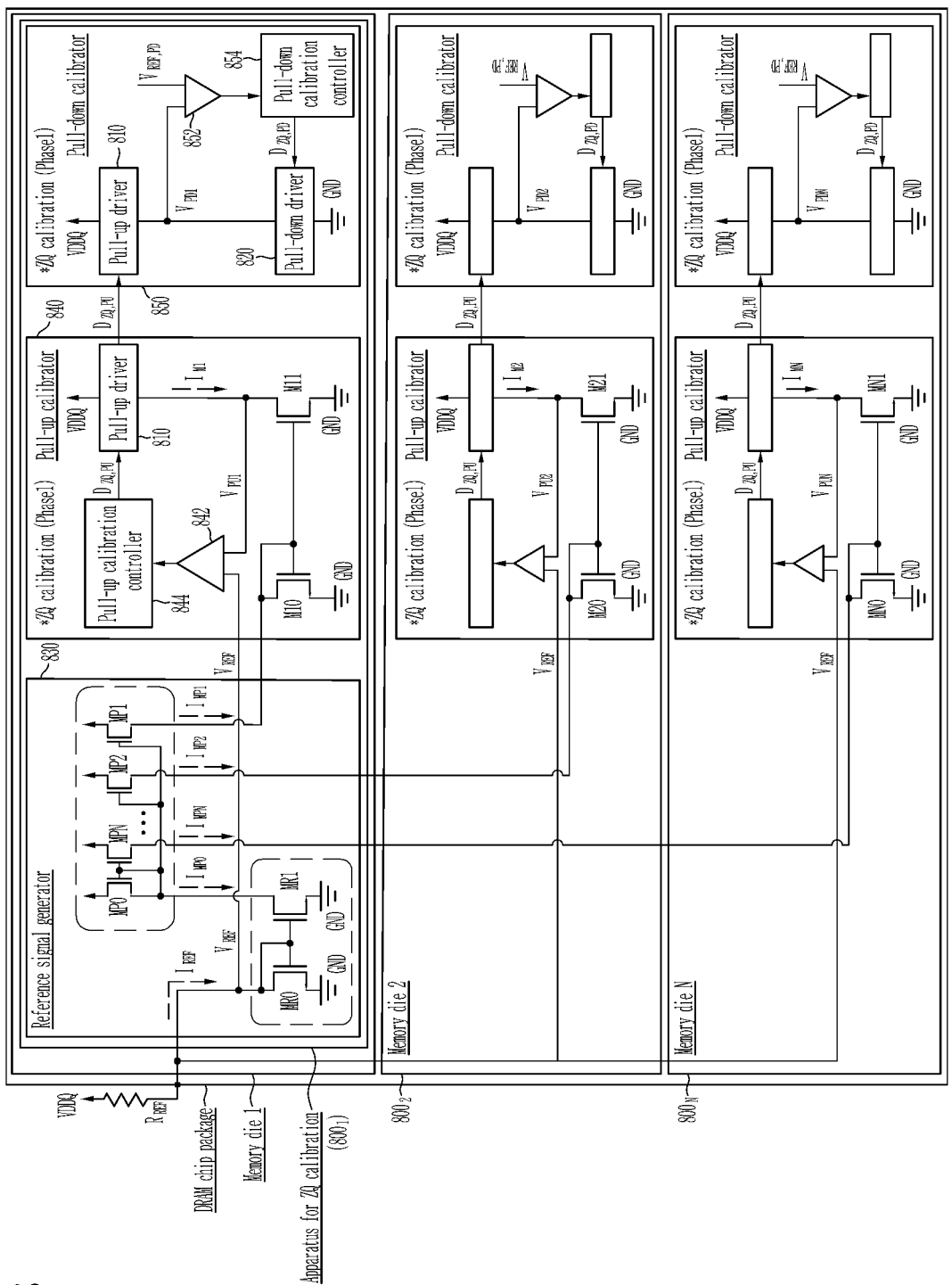
FIG. 8 is a diagram illustrating an apparatus for ZQ calibration of a data transmission driving circuit for a memory chip package having a multi-memory die structure according to another embodiment.

FIG. 8 is a diagram illustrating an apparatus for ZQ calibration of a data transmission driving circuit for a memory chip package having a multi-memory die structure according to another embodiment.

In FIG. 6, the reference signal generator 530 of the apparatus for ZQ calibration $500_1$ of the memory die 1 generates a reference voltage $V_{REF}$ using the reference resistor $R_{REF}$ and a diode-connected transistor M0, and each current mirror is formed between the diode-connected transistor M0 and the pull-up calibrator 810 of the apparatus for ZQ calibration $500_1$ to $500_N$ of each memory die.

Meanwhile, referring to FIG. 8, the reference signal generator 830 of the apparatus for ZQ calibration $800_1$ of the memory die 1 forms a current mirror by adding the transistor MR1 to the structure using the reference resistor $R_{REF}$ and the diode-connected transistor MR0. Furthermore, the reference signal generator 830 generates reference currents $I_{REF1}$ to $I_{REFN}$ of the same size using additional transistors MP0 to MPN and supplies them to the pull-up calibrator 840 of the apparatus for ZQ calibration $800_1$ to $800_N$ of each memory die.

That is, if the transistors MR0 and MR1 have the same size and the transistors MP0 through MPN have the same size, the size of the reference currents $I_{REF1}$ to $I_{REFN}$ supplied to the pull-up calibrator 840 of the apparatus for ZQ calibration $800_1$ to $800_N$ of each memory die is equal to the reference current $I_{REF}$ formed through the reference resistance $R_{REF}$ and the diode-connected transistor MR0.

The pull-up calibrator 840 of the apparatus for ZQ calibration $800_1$ to $800_N$ of each memory die supplies currents $I_{M1}$ to $I_{MN}$ corresponding to the reference currents $I_{REF1}$ to $I_{REFN}$ to the pull-up driver 810 using two transistors M10 and M11 to MN0 and MN1 configured in the form of a current mirror.

Specifically, in the case of memory die 1, if the transistors M10 and M11 have the same size, the current $I_{M1}$ has the same size as the reference current $I_{REF1}$. In the case of memory die 2, if the transistors M20 and M21 have the same size, the current $I_{M2}$ has the same size as the reference current $I_{REF2}$. The same applies to the rest of the memory die.

In this way, the apparatus for ZQ calibration $800_1$ to $800_N$ of all memory die 1 to memory die N simultaneously perform the ZQ calibration by supplying the currents $I_{M1}$ to $I_{MN}$ generated for each memory die to the pull-up driver 810 to be ZQ calibrated, and sharing the reference voltage $V_{REF}$ generated by the reference signal generator 830 of the memory die 1.

In the case of the structure proposed in FIG. 8, the hardware complexity of the reference signal generator 830 is increased compared to the structure proposed in FIG. 6, but reference currents $I_{REF1}$ to $I_{REFN}$ are generated by forming a current mirror in one memory die, and the apparatus for ZQ calibration $800_1$ to $800_N$ of each memory die perform the ZQ calibration of the data transmission driving circuit based on the reference currents $I_{REF1}$ to $I_{REFN}$. In this case, as described above, by removing the influence of the mismatch of transistors between different memory dies, it is possible to minimize the mismatch of the output impedance of the ZQ calibrated data transmission driving circuit for each memory die due to the mismatch of the transistors.

According to an embodiment, in a memory chip package having a multi-memory die structure in which a plurality of memory dies are stacked, the time required for ZQ calibration of the entire memory chip package may be implemented to be the same as the time required for ZQ calibration in the data transmission driving circuit of one memory die. Accordingly, the ZQ calibration time of the data transmission driving circuit performed when the power is applied to the memory can be reduced, and the time required for ZQ calibration in the ZQ calibration time process, which must be frequently performed when the operating environment changes during memory operation, is reduced. Therefore, interruption of data transmission during the ZQ calibration time can be minimized, and data transmission efficiency per unit time of the entire memory system can be increased.

The components described in the example embodiments may be implemented by hardware components including, for example, at least one digital signal processor (DSP), a processor, a controller, an application-specific integrated circuit (ASIC), a programmable logic element such as an FPGA, other electronic devices, or combinations thereof. At least some of the functions or the processes described in the example embodiments may be implemented by software, and the software may be recorded on a recording medium. The components, functions, and processes described in the example embodiments may be implemented by a combination of hardware and software. The method according to embodiments may be embodied as a program that is executable by a computer, and may be implemented as various recording media such as a magnetic storage medium, an optical reading medium, and a digital storage medium. Various techniques described herein may be implemented as digital electronic circuitry, or as computer hardware, firmware, software, or combinations thereof. The techniques may be implemented as a computer program product, i.e., a computer program tangibly embodied in an information carrier, e.g., in a machine-readable storage device (for example, a computer-readable medium) or in a propagated signal for processing, or to control an operation of a data processing apparatus, e.g., by a programmable processor, a computer, or multiple computers. A computer program(s) may be written in any form of programming language, including compiled or interpreted languages, and may be deployed in any form including a stand-alone program or a module, a component, a subroutine, or other units suitable for use in a computing environment. A computer program may be deployed to be executed on one computer or on multiple computers at one site or distributed across multiple sites and interconnected by a communication network. Processors suitable for execution of a computer program include, by way of example, both general and special purpose microprocessors, and any one or more processors of any kind of digital computer. Generally, a processor will receive instructions and data from a read-only memory or a random access memory or both. Elements of a computer may include at least one processor to execute instructions and one or more memory devices to store instructions and data. Generally, a computer will also include or be coupled to receive data from, transfer data to, or perform both on one or more mass storage devices to store data, e.g., magnetic or magneto-optical disks, or optical disks. Examples of information carriers suitable for embodying computer program instructions and data include semiconductor memory devices, for example, magnetic media such as a hard disk, a floppy disk, and a magnetic tape, optical media such as a compact disk read only memory (CD-ROM), a digital video disk (DVD), etc., and magneto-optical media such as a floptical disk and a read only memory (ROM), a random access memory (RAM), a flash memory, an erasable programmable ROM (EPROM), and an electrically erasable programmable ROM (EEPROM), and any other known computer readable media. A processor and a memory may be supplemented by, or integrated into, a special purpose logic circuit. The processor may run an operating system (08) and one or more software applications that run on the OS. The processor device also may access, store, manipulate, process, and create data in response to execution of the software. For purpose of simplicity, the description of a processor device is used as singular; however, one skilled in the art will appreciate that a processor device may include multiple processing elements and/or multiple types of processing elements. For example, a processor device may include multiple processors or a processor and a controller. In addition, different processing configurations are possible, such as parallel processors. Also, non-transitory computer-readable media may be any available media that may be accessed by a computer, and may include both computer storage media and transmission media. The present specification includes details of a number of specific implements, but it should be understood that the details do not limit any disclosure or what is claimable in the specification but rather describe features of the specific example embodiment. Features described in the specification in the context of individual example embodiments may be implemented as a combination in a single example embodiment. In contrast, various features described in the specification in the context of a single example embodiment may be implemented in multiple example embodiments individually or in an appropriate sub-combination. Furthermore, the features may operate in a specific combination and may be initially described as claimed in the combination, but one or more features may be excluded from the claimed combination in some cases, and the claimed combination may be changed into a sub-combination or a modification of a sub-combination. Similarly, even though operations are described in a specific order in the drawings, it should not be understood as the operations needing to be performed in the specific order or in sequence to obtain desired results or as all the operations needing to be performed. In a specific case, multitasking and parallel processing may be advantageous. In addition, it should not be understood as requiring separation of various apparatus components in the above-described example embodiments in all example embodiments, and it should be understood that the above-described program components and apparatuses may be incorporated into a single software product or may be packaged in multiple software products. It should be understood that the embodiments disclosed herein are merely illustrative and are not intended to limit the scope of the disclosure. It will be apparent to one of ordinary skill in the art that various modifications of the embodiments may be made without departing from the spirit and scope of the claims and their equivalents.

What is claimed is:

1. A method for ZQ calibration for a data transmission driving circuit of each memory die in a memory chip package in which a plurality of memory dies are stacked, the method comprising:
   generating a reference current or a reference voltage through a reference resistor connected between a power terminal supplying a power voltage of the data transmission driving circuit and a ground terminal and a first transistor that is diode-connected, wherein the reference current or the reference voltage is generated on a first memory die of the plurality of memory dies and shared with the other memory dies of the plurality of memory dies;
   supplying a plurality of first currents corresponding to the reference current or the reference voltage to pull-up drivers of the plurality of memory dies, respectively;
   performing ZQ calibration of pull-up drivers of the plurality of memory dies, respectively, wherein ZQ calibration of a pull-up driver of the first memory die is performed simultaneously with ZQ calibration of pull-up drivers of the other memory dies; and
   performing ZQ calibration of pull-down drivers of the plurality of memory dies respectively, wherein ZQ calibration of a pull-down driver is performed based on an output impedance of a corresponding ZQ calibrated pull-up driver in the same memory die.

2. The method of claim 1, wherein
the supplying includes generating the plurality of first currents through a plurality of second transistors forming a current mirror with the first transistor.

3. The method of claim 2, wherein
each of the plurality of second transistors is connected between a pull-up driver of each memory die and the ground terminal,
the ZQ calibration of each pull-up driver is performed by comparing a first voltage formed by each first current with the reference voltage formed by the reference current in each of the plurality of memory dies, and
the first voltage is a voltage at a node between a pull-up driver of each memory die and each second transistor.

4. The method of claim 3, wherein
the supplying includes:
generating a second current corresponding to the reference current through a second transistor forming a current mirror with the first transistor;
generating a plurality of third currents through a plurality of fourth transistors forming a current mirror with a third transistor connected between the power terminal and the second transistor; and
generating the plurality of first currents through a plurality of sixth transistors forming a current mirror with each of a plurality of fifth transistors respectively connected between the plurality of fourth transistors and the ground terminal.

5. The method of claim 4, wherein
each of the plurality of sixth transistors is connected between a pull-up driver of each memory die and the ground terminal, and
the first voltage is a voltage at a node between a pull-up driver of each memory die and each sixth transistor.

6. An apparatus for ZQ calibration for a data transmission driving circuit of each memory die in a memory chip package in which a plurality of memory dies are stacked, the apparatus comprising:
   a pull-up calibrator that performs ZQ calibration of a pull-up driver by comparing a first voltage formed by a first current supplied to the pull-up driver with a reference voltage formed by a reference current in each of the plurality of memory dies, wherein the first current corresponds to the reference current generated through a reference resistor connected between a power terminal supplying a power voltage of the data transmission driving circuit and a ground terminal and a first transistor that is diode-connected; and
   a pull-down calibrator that performs ZQ calibration of a pull-down driver based on an output impedance of the ZQ calibrated pull-up driver in each memory die,
   wherein each memory die of the plurality of memory dies includes the pull-up calibrator and the pull-down calibrator, and
   wherein ZQ calibration of a pull-up calibrator of a first memory die of the plurality of memory dies is performed simultaneously with ZQ calibration of pull-up calibrators of the other memory dies of the plurality of memory dies.

7. The apparatus of claim 6, wherein
the pull-up calibrator includes a second transistor configured to form a current mirror with the first transistor and supply the first current to the pull-up driver.

8. The apparatus of claim 6, further comprising
a reference signal generator that generates the reference voltage by the reference current flowing through the reference resistor and the first transistor that is diode-connected, wherein
the reference signal generator includes:
a second transistor for generating a second current corresponding to the reference current by forming a current mirror with the first transistor;
a third transistor connected between the power terminal and the second transistor; and
a plurality of fourth transistors for generating a plurality of third currents by forming a current mirror with the third transistor.

9. The apparatus of claim 8, wherein
the pull-up calibrator includes:
a fifth transistor connected between one of the plurality of fourth transistors and a ground terminal; and
a sixth transistor forming a current mirror with the fifth transistor to supply the first current to the pull-up driver.

10. The apparatus of claim 6, wherein
the pull-up calibrator includes:
a pull-up comparator comparing the first voltage with the reference voltage; and
a pull-up calibration controller for performing the ZQ calibration of the pull-up driver based on a comparison result of the first voltage and the reference voltage.

11. The apparatus of claim 6, further comprising
a reference signal generator that generates the reference voltage by the reference current flowing through the reference resistor and the first transistor that is diode-connected, wherein
the reference signal generator is formed only in the first memory die of the plurality of memory dies.

12. The apparatus of claim 11, wherein
the reference voltage, which is generated on the first memory die, is shared with the other memory dies.

13. The apparatus of claim 6, wherein
ZQ calibration of a pull-down calibrator of the first memory die is performed simultaneously with ZQ calibration of pull-up calibrators of the other memory dies.

* * * * *